(12) United States Patent
Sawano et al.

(10) Patent No.: US 8,455,182 B2
(45) Date of Patent: Jun. 4, 2013

(54) COMPOSITION FOR ANTIREFLECTION FILM FORMATION AND METHOD FOR RESIST PATTERN FORMATION USING THE COMPOSITION

(75) Inventors: Atsushi Sawano, Kanagawa (JP); Jun Koshiyama, Kanagawa (JP); Takako Hirosaki, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 667 days.

(21) Appl. No.: 12/451,747

(22) PCT Filed: May 16, 2008

(86) PCT No.: PCT/JP2008/059045
§ 371 (c)(1), (2), (4) Date: Nov. 30, 2009

(87) PCT Pub. No.: WO2008/146625
PCT Pub. Date: Dec. 4, 2008

(65) Prior Publication Data
US 2010/0104987 A1    Apr. 29, 2010

(30) Foreign Application Priority Data
Jun. 1, 2007  (JP) .................................. 2007-147410

(51) Int. Cl.
*G03F 7/11*   (2006.01)
*G03F 7/30*   (2006.01)

(52) U.S. Cl.
USPC ..................... 430/325; 430/326; 430/273.1

(58) Field of Classification Search
None
See application file for complete search history.

(56) References Cited

U.S. PATENT DOCUMENTS

| 4,910,122 A | 3/1990 | Arnold et al. | |
| 2005/0227151 A1* | 10/2005 | Hata et al. | 430/5 |
| 2007/0059639 A1* | 3/2007 | Kanda et al. | 430/270.1 |
| 2007/0072118 A1* | 3/2007 | Nishiyama et al. | 430/270.1 |
| 2007/0160930 A1* | 7/2007 | Wang et al. | 430/270.1 |
| 2007/0212646 A1* | 9/2007 | Gallagher et al. | 430/270.1 |
| 2009/0253077 A1* | 10/2009 | Shirai et al. | 430/311 |

FOREIGN PATENT DOCUMENTS

| JP | 3-222409 | 10/1991 |
| JP | 4-55323 | 2/1992 |
| JP | 2005-103893 | 4/2005 |
| JP | 2005-257826 | 9/2005 |
| JP | 2006-56139 | 3/2006 |
| WO | 2007/043556 | 4/2007 |
| WO | 2007/044110 | 4/2007 |

OTHER PUBLICATIONS

Mansouri et al , Jouranl of Applied polymer Science, vol. 106, pp. 1683-1688 (2007).Article first published online: Jul. 17, 2007 | DOI: 10.1002/app.26749.*
"New Technology Offers a Green Light to Develp Better Coatings", PCI Paint & Coatings Industry , Nov. 1, 2002, 6 pages obtained from http://www.pcimag.com/articles/print/new-technology-offers-a-green-light-to-develop-bett . . . .*
"Novel Fluorinated materials Replace long Chain Surfactants" PCI Paint & Coatings Industry , May 31, 2002, 8 pages obtained from http://www.pcimag.com/articles/print/novel-fluorinated-materials-replace-long-chain-surfactants.*
International Search Report issued Jun. 17, 2008 in International (PCT) Application No. PCT/JP2008/059045.

* cited by examiner

*Primary Examiner* — Cynthia Hamilton
(74) *Attorney, Agent, or Firm* — Wenderoth, Lind & Ponack, L.L.P.

(57) ABSTRACT

A composition for forming an anti-reflection film for use in forming an anti-reflection film on a resist film is provided, the composition for forming an anti-reflection film being easily handled, and capable of forming an anti-reflection film having superior optical characteristics similarly to anti-reflection films formed using PFOS. A composition for forming an anti-reflection film to be provided on a resist film which includes a certain fluorine compound. This composition for forming an anti-reflection film can form an anti-reflection film having superior optical characteristics since the certain fluorine compound contributes to improvement of the optical characteristics of the anti-reflection film.

7 Claims, No Drawings

COMPOSITION FOR ANTIREFLECTION FILM FORMATION AND METHOD FOR RESIST PATTERN FORMATION USING THE COMPOSITION

TECHNICAL FIELD

The present invention relates to a composition for forming an anti-reflection film to be provided on a resist film, and a method for forming a resist pattern using the composition for forming an anti-reflection film.

BACKGROUND ART

Semiconductor wiring substrates are, as is generally known, formed by laminating at least a dielectric layer (insulation layer) on a silicon wafer or the like. A patterned conductive layer (i.e., a wiring layer) is then formed in the dielectric layer to form a semiconductor wiring structure.

The formation of the wiring layer is carried out as follows. First, a conductive layer is formed on a dielectric layer uniformly, and a resist film is formed on this conductive layer. A resist pattern is formed by irradiating (exposing) this resist film with a patterning light, followed by development, and a wiring layer is formed by patterning of the conductive layer with an etching process using the resist pattern as a mask. Then, after removing the resist film completely, a dielectric layer is further laminated on the conductive layer to configure a wiring layer in the dielectric layer.

It has been conventionally known that a problem referred to as a stationary wave effect due to multiple interference occurs when a pattern is formed by irradiating a resist film with light in the step of forming a wiring layer. That is, irradiated light is transmitted through the resist film, and the transmitted light is reflected on an underlayer surface and a part of the reflected light is further reflected on an upper surface of the resist film, with such event being repeated in the resist film. As a result of interference between light irradiated at a single wavelength, which has entered the resist film formed on the substrate, and light reflected from the substrate, variation in the amount of light energy absorbed in a thickness direction of the resist film occurs. This variation affects a size width of the resist pattern obtained after development, resulting in a reduction of the dimensional accuracy of the resist pattern.

This reduction in the dimensional accuracy of the resist pattern is of significant concern, particularly when a fine pattern is formed on a substrate having varying levels because the thickness of the resist film becomes inevitably different at the relief structures in portions having such varying levels. Thus, it has been desired to develop a technology in which the above interference effect is eliminated and the dimensional accuracy of the resist pattern is not reduced even in the case of fine patterns formed on a substrate having varying levels.

Consequently, a method in which an anti-reflection film having a property of absorbing the exposed light is formed before forming a resist film on a substrate and a resist film is formed on the anti-reflection film (for example, Patent Document 1, etc.); and a method in which an anti-reflection film constituted with polysiloxane, polyvinyl alcohol or the like is formed on a resist film provided on a substrate (for example, Patent Documents 2 and 3, etc.) have been employed conventionally.

Patent Document 1: U.S. Pat. No. 4,910,122.
Patent Document 2: Japanese Examined Patent Application Publication No. H04-55323.
Patent Document 3: Japanese Unexamined Patent Application Publication No. H03-222409.

DISCLOSURE OF THE INVENTION

Problems to be Solved by the Invention

However, in the method in which an anti-reflection film is formed on a substrate, mask alignment carried out using a light having the same wavelength as that of the exposure light may be disadvantageous since the detection signal of the mask alignment is attenuated by the anti-reflection film, thereby leading to difficulties in aligning the mask. In addition, it is necessary to transfer the resist pattern to the anti-reflection film with favorable accuracy, and the anti-reflection film must be removed by etching or the like without affecting the substrate following the transfer. Thus, the number of operation steps increases accordingly; therefore, the method cannot always be applied to any substrate processing.

On the other hand, the method of forming an anti-reflection film on a resist film provided on a substrate is suitable for practical use, without need of complicated steps.

However, in such a method in which an anti-reflection film is formed on a resist film provided on a substrate, $C_8F_{17}SO_3H$ (PFOS) is used at present as a fluorochemical surfactant in the composition for forming an anti-reflection film. This substance is problematic in handling since it is a designated chemical substance in Japan, and also is subject to Significant New Use Rule (SNUR) that is a rule related to ecological effects in USA. Specifically, the substance relevant to SNUR can involve taking risks which may impair the health or environment, therefore, wearing of protective equipment in the workplace, and notice, education, training and the like for employees about hazardous properties are required. Furthermore, disposal is also regulated. Therefore, a composition for forming an anti-reflection film which includes in place of $C_8F_{17}SO_3H$ (PFOS), a fluorochemical surfactant that can be easily handled without environmental problems, and exhibits similar effects to those achieved when $C_8F_{17}SO_3H$ (PFOS) is used has been demanded.

The present invention was made in view of the foregoing problems, and an object of the invention is to provide a composition for forming an anti-reflection film for use in forming an anti-reflection film on a resist film, the composition for forming an anti-reflection film being easily handled, and capable of forming an anti-reflection film having superior optical characteristics similarly to anti-reflection films formed using PFOS.

Means for Solving the Problems

The present inventors found that a composition for forming an anti-reflection film that includes a certain fluorine compound is easily handled, and capable of forming an anti-reflection film having superior optical characteristics. Accordingly, the present invention was accomplished. Specifically, the present invention provides the following.

The first aspect of the present invention provides a composition for forming an anti-reflection film to be provided on a resist film, the composition including 0.3% by mass to 10% by mass of a compound having a constituent unit represented by the following general formula (1):

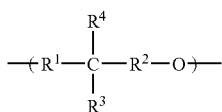

in the above general formula (1), $R^1$ and $R^2$ each represent a direct bond or a methylene chain; $R^3$ and $R^4$ each represent a hydrogen atom, an alkyl group having 1 to 10 carbon atoms, or a group represented by $-(CH_2)_n-O-R^5-R^6$; and at least one of $R^3$ and $R^4$ is a group represented by $-(CH_2)_n-O-R^5-R^6$, wherein: $R^5$ represents a direct bond or an alkylene chain having 1 to 10 carbon atoms which may be interrupted with $-O-$; $R^6$ represents an alkyl group having 1 to 10 carbon atoms in which a portion or all hydrogen atoms are substituted with a fluorine atom; and n represents an, integer of 0 to 10, and wherein, the total number of carbon atoms present in $R^1$ and $R^2$ is 1 or 2.

The second aspect of the present invention provides a method for forming a resist pattern, the method including: forming a resist film on a substrate; forming an anti-reflection film on the resist film using the composition for forming an anti-reflection film of the present invention; selectively irradiating the resist film, through the anti-reflection film, with light, and carrying out a heat treatment as needed; and removing the anti-reflection film to obtain the resist pattern before subjecting the irradiated resist film to a developing process or during the development process.

Effects of the Invention

The composition for forming an anti-reflection film of the present invention can form an anti-reflection film having superior optical characteristics since a certain fluorine compound contained therein contributes to the improvement of the optical characteristics of the anti-reflection film.

PREFERRED MODE FOR CARRYING OUT THE INVENTION

Hereinafter, embodiments of the present invention will be explained in detail.
Composition for Forming Anti-Reflection Film The composition for forming an anti-reflection film of the present invention includes a certain fluorine compound. In addition, the composition for forming an anti-reflection film of the present invention may further include a water soluble film-forming component, a fluorochemical surfactant, a nitrogen-containing compound, and a nonionic surfactant, or an anionic surfactant.
Fluorine Compound
Structure of Fluorine Compound The composition for forming an anti-reflection film of the present invention includes a fluorine compound having a constituent unit represented by the following general formula (1):

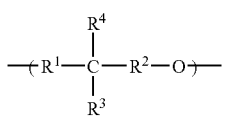

in the above general formula (1), $R^1$ and $R^2$ each represent a direct bond or a methylene chain; $R^3$ and $R^4$ each represent a hydrogen atom, an alkyl group having 1 to 10 carbon atoms, or a group represented by $-(CH_2)_n-O-R^5-R^6$; and at least one of $R^3$ and $R^4$ is a group represented by $-(CH_2)_n-O-R^5-R^6$, wherein: $R^5$ represents a direct bond or an alkylene chain having 1 to 10 carbon atoms which may be interrupted with $-O-$; $R^6$ represents an alkyl group having 1 to 10 carbon atoms in which a portion or all hydrogen atoms are substituted with a fluorine atom; and n represents an integer of 0 to 10, and wherein, the total number of carbon atoms present in $R^1$ and $R^2$ is 1 or 2.

Since the fluorine compound having a constituent unit represented by the above general formula (1) has a fluorine atom, the refractive index (n value) and the extinction coefficient (k value) can be kept at a low level in the anti-reflection film including this compound. Thus, according to the composition for forming an anti-reflection film of the present invention, formation of an anti-reflection film that is superior in the optical characteristics is enabled.

In addition, the composition for forming an anti-reflection film of the present invention including the fluorine compound having a constituent unit represented by the above general formula (1) has low foaming properties, and thus residual bubbles in the anti-reflection film coated on the resist film can be excluded. Moreover, since the main chain has a polar group, high water solubility may be achieved, and therefore, deposition in the anti-reflection film can be also avoided. By virtue of the properties described above, when an anti-reflection film is formed using the composition for forming an anti-reflection film of the present invention, the risk of generating the surface defect and the like can be yet suppressed, and a semiconductor wiring substrate can be efficiently manufactured using the anti-reflection film.

Moreover, the fluorine compound having the constituent unit represented by the above general formula (1) can serve as a film-forming component in a composition for forming an anti-reflection film. Thus, the composition for forming an anti-reflection film containing the fluorine compound does not necessarily include a water soluble resin described later.

The fluorine compound having a constituent unit represented by the above general formula (1) is preferably a polymer of a cyclic ether having a fluorinated alkyl group as a side chain, or a copolymer prepared by copolymerization of the cyclic ether having a fluorinated alkyl group with other monomer. As the other monomer, any of cyclic ethers, acrylate, vinyl compounds, silane, siloxane, polyester-forming monomers, polyamide-forming monomers, and polyurethane-forming monomers may be exemplified. In addition, exemplary cyclic ethers having a fluorinated alkyl group as a side chain may include oxetanes and epoxides having the fluorinated alkyl group. When the fluorine compound represented by the above general formula (1) is a copolymer, the copolymer may be either a random copolymer, or a block copolymer.

It is preferred that the fluorine compound having a constituent unit represented by the above general formula (1) has a covalently bound polar group for further improving the water solubility. Examples of the polar group include: anionic groups such as a carboxyl group, a sulfonic acid group, a sulfuric acid group and a phosphoric acid group; cationic groups such as an amino group, and a phosphino group; and nonionic groups such as a polyether group, a polyethylene oxide group, and a polypropylene oxide group having a degree of polymerization of 1 to 100, and preferably 2 to 25. These polar groups are preferably bound covalently to the end of the fluorine compound having a constituent unit represented by the above general formula (1), but may be present in the main chain of the fluorine compound.

As the fluorochemical surfactant having the constituent unit represented by the general formula (1), for example, compounds represented by the following formulae (1a) to (1f) may be exemplified.

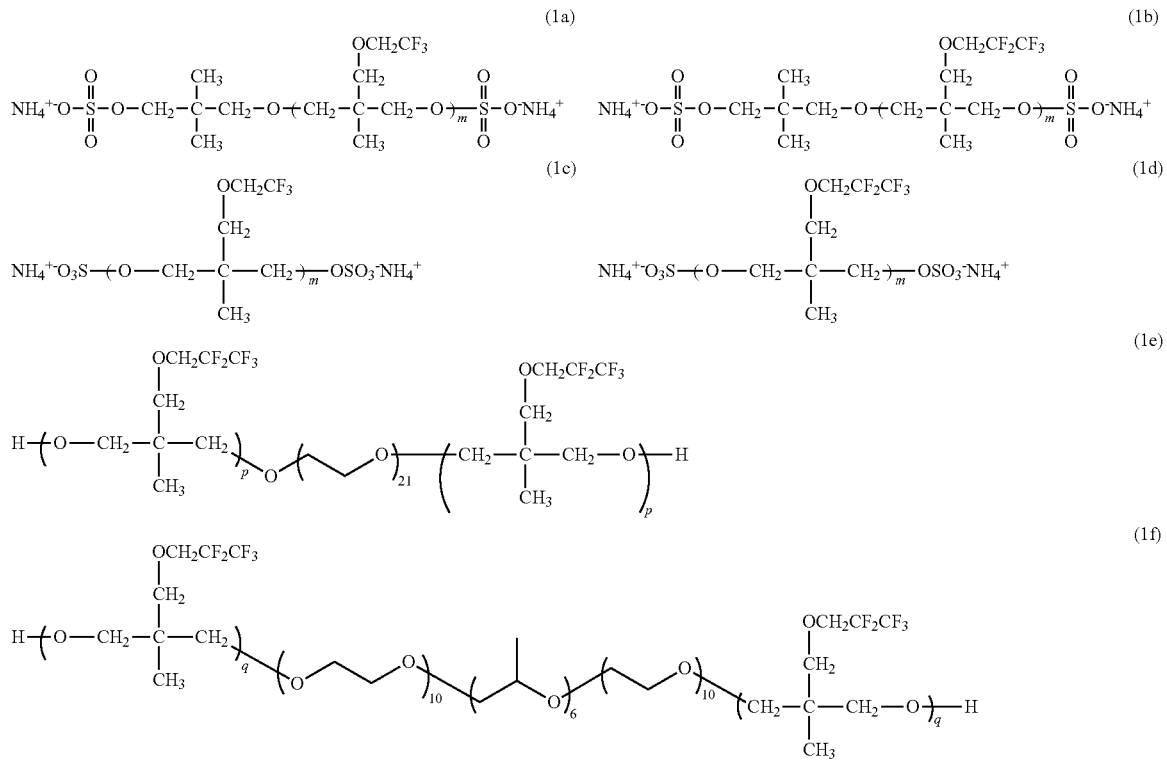

In the above formulae (1a) to (1f), m, p, and q represent the degree of polymerization; m represents an integer of 6 to 8; p represents an integer of 1 to 4; and q represents 2 or 3.

In the composition for forming an anti-reflection film of the present invention, the content of the fluorine compound having a constituent unit represented by the above general formula (1) is 0.3% by mass to 10% by mass. By adjusting the content of the fluorine compound to fall within the above range, favorable optical characteristics of the anti-reflection film can be maintained, while enabling formation of an anti-reflection film having a sufficient film thickness. The content is more preferably no less than 0.5% by mass and no greater than 5% by mass, and particularly preferably no less than 0.5% by mass and no greater than 3% by mass.

Although the composition for forming an anti-reflection film of the present invention can include a film-forming component described later, the amount of the fluorine compound added to the composition is preferably adjusted appropriately such that the solid content in the composition for forming an anti-reflection film accounts for 0.3% by mass to 8% by mass, when such a film-forming component is included.

Method for Production of Fluorine Compound

The fluorine compound having a constituent unit represented by the above general formula (1) is obtained by carrying out a polymerization reaction using a cyclic ether represented by the following general formula (6) as one monomer in a conventionally well-known inert solvent. As the inert solvent, hydrocarbon or halogenated hydrocarbon having 1 to 6 carbon atoms may be exemplified, and specific examples include methylene chloride, carbon tetrachloride, trichloromethane, chlorobenzene, dichloroethane, and the like. The polymerization reaction may be carried out in the presence of a boron trifluoride complex such as $BF_3$-ethelate, $BF_3$-THF, and $BF_3$-THPYRAN; phosphorus pentafluoride; antimony pentafluoride; zinc chloride; and a Lewis catalyst such as aluminum bromide, and is preferably carried out in the presence of $BF_3$-THF. As the initiator, a monovalent or bivalent alcohol having 2 to 5 carbon atoms, and including a C—F bond or a C—H bond, or both of these bonds can be used. Specific examples of the alcohol include ethylene glycol, butane-1,4-diol, propylene glycol, isobutane-1,3-diol, pentane-1,5-diol, pentaerythritol, trimethylolpropane, methanol, and the like.

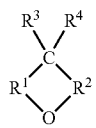

(6)

In the above general formula (6), $R^1$ and $R^2$ each represent a direct bond or a methylene chain; $R^3$ and $R^4$ each represent a hydrogen atom, an alkyl group having 1 to 10 carbon atoms, or a group represented by —$(CH_2)_n$—O—$R^5$—$R^6$; and at least one of $R^3$ and $R^4$ is a group represented by —$(CH_2)_n$—O—$R^5$—$R^6$, wherein: $R^5$ represents a direct bond or an alkylene chain having 1 to 10 carbon atoms which may be interrupted with —O—; $R^6$ represents an alkyl group having 1 to 10 carbon atoms in which a portion or all hydrogen atoms are substituted with a fluorine atom; and n represents an integer of 0 to 10. Wherein, the total number of carbon atoms present in $R^1$ and $R^2$ is 1 or 2.

Water Soluble Film-Forming Component

The composition for forming an anti-reflection film of the present invention may further include a water soluble film-forming component as needed. The water soluble film-forming component is not particularly limited as long as it has transparency to irradiation light, and is preferably one having the characteristic features of: (i) capable of forming a uniform coating film by any conventional means for coating, such as a spin-coating method; (ii) having no deterioration layer formed between the resist film and the water soluble film-forming component, even if the component is applied on the resist film; (iii) being sufficiently penetrated by an active light beam; and (iv) being able to form an anti-reflection film having a small absorption coefficient and a high transparency.

Examples of such water soluble film-forming components include water soluble resins, for example: cellulosic polymers such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxyethyl cellulose, cellulose acetate hexahydrophthalate, carboxymethyl cellulose, ethyl cellulose, and methyl cellulose; acrylic acid based polymers constituted with a monomer such as acrylamide, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloylmorpholine, hydroxyethyl acrylate, and acrylic acid; vinyl based polymers such as polyvinyl alcohol, and polyvinylpyrrolidone; copolymers of vinylpyrrolidone/acrylic acid; and copolymers of acrylamide/diacetoneacrylamide. Among these, acrylic acid-based polymers, polyvinylpyrrolidone and the like can be preferably used. These water soluble film-forming components may be used alone or may be used in combinations of two or more of them.

The water soluble resin has a mass average molecular weight of preferably 1,000 to 1,000,000, and more preferably 10,000 to 300,000. By adjusting the mass average molecular weight of the water soluble resin to fall within the above range, coating stability can be improved.

The content of the water soluble film-forming component in the composition for forming an anti-reflection film of the present invention is preferably 0.5% by mass to 10.0% by mass. When the content of the water soluble film-forming component falls within the above range, the anti-reflection film can be formed in a sufficient amount of the coating film, while keeping favorable coating properties of the composition for forming an anti-reflection film. The content is more preferably no less than 0.5% by mass and no greater than 5.0% by mass, and particularly preferably no less than 0.5% by mass and no greater than 3.0% by mass.

Fluorochemical Surfactant

The anti-reflection film forming material of the present invention may also include a fluorochemical surfactant for further improving the optical characteristics of the anti-reflection film to be formed. The fluorochemical surfactant is at least one selected from the compounds represented by the following general formulae (2) to (5).

In the above general formulae (2) to (5); r represents an integer of 10 to 15; s represents an integer of 1 to 5; t represents 2 or 3; u represents 2 or 3; and $R_f$ represents a hydrogen atom or an alkyl group having 1 to 16 carbon atoms in which a portion or all hydrogen atoms are substituted with a fluorine atom. The alkyl group may have a hydroxy group, an alkoxyalkyl group, a carboxyl group, or an amino group.

Specifically, as the fluorochemical surfactant represented by the general formula (2), the compound represented by the following formula (2a) is preferred.

Specifically, as the fluorochemical surfactant represented by the general formula (3), the compound represented by the following formula (3a) or (3b) is preferred.

Specifically, as the fluorochemical surfactant represented by the general formula (4), the compound represented by the following formula (4a) is preferred.

Specifically, as the fluorochemical surfactant represented by the general formula (5), the compound represented by the following formula (5a) is preferred.

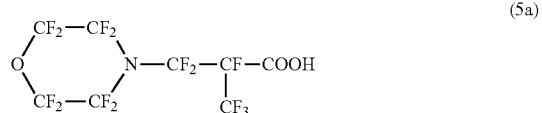

When such a fluorochemical surfactant is used, the optical characteristics of the anti-reflection film can be further improved, and favorable film coating performance of the anti-reflection film can be achieved.

The content of the fluorochemical surfactant used in the composition for forming an anti-reflection film is preferably no less than 0.0001% by mass and no greater than 10% by mass, and more preferably no less than 0.01% by mass and no greater than 3% by mass. When the fluorochemical surfactant is included at a content falling within the above range, an anti-reflection film having further favorable anti-reflection characteristics and film coating performance can be obtained.

Nitrogen-Containing Compound

The composition for forming an anti-reflection film of the present invention may further include a nitrogen-containing compound. Examples of suitable nitrogen-containing compound include quaternary ammonium hydroxide, alkanolamine compounds, and amino acid derivatives.

Examples of the quaternary ammonium hydroxide include tetramethylammonium hydroxide, tetraethylammonium hydroxide, tetrapropylammonium hydroxide, tetrabutylammonium hydroxide, methyltripropylammonium hydroxide, methyltributylammonium hydroxide, choline, and the like.

Examples of the alkanolamine compound include 3-amino-1,2-propanediol, 2-amino-1,3-propanediol, triisopropanolamine, triethanolamine, amino-2-methyl-1,3-propanediol, and the like.

Examples of the amino acid derivative include glycine, alanine, valine, leucine, isoleucine, proline, phenylalanine, tryptophan, methionine, serine, threonine, cysteine, tyrosine, asparagine, glutamine, aspartic acid, glutamic acid, lysine, arginine, histidine, 4-hydroxyproline, desmosin, γ-aminobutyric acid, β-cyanoalanine, and the like.

The foregoing nitrogen-containing compounds may be used alone, or in combination. Also, alkanolamine compounds are preferred among these nitrogen-containing compounds, and 3-amino-1,2-propanediol and 2-amino-1,3-propanediol are more preferred.

Surfactant

The composition for forming an anti-reflection film of the present invention may further include a nonionic surfactant or an anionic surfactant for the purpose of improving coating properties.

Nonionic Surfactant

Examples of the nonionic surfactant include those represented by the general formula (7):

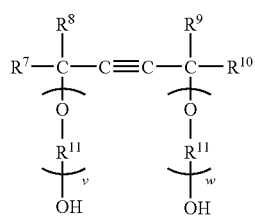
(7)

in the general formula (7), $R^7$ to $R^{10}$ each independently represent a straight or branched alkyl group having 1 to 6 carbon atoms; $R^{11}$ represents a straight or branched alkylene chain having 2 to 4 carbon atoms; and v and w each independently represent an integer of 0 to 30.

Wherein, $R^7$ to $R^{10}$ are preferably a methyl group, an ethyl group, or an isopropyl group. $R^7$ is preferably an ethylene chain, a propylene chain, or a butylene chain. Moreover, v and w are preferably an integer of 0 to 16.

Specific examples of the nonionic surfactant represented by the above general formula (7) include "Surfinol 104 series" and "Surfinol 400 series" manufactured by Air Products and Chemicals, Inc., and the like. Of these, "Surfinol 104 series" is preferred.

Anionic Surfactant

Examples of the anionic surfactant include those represented by the general formula (8):

$$R^{12}-SO_3H \qquad (8)$$

in the above general formula (8), $Ru^{12}$ represents a straight or branched alkyl group having 7 to 20 carbon atoms, and the alkyl group may have a hydroxy group and/or a carboxyl group, and may be interrupted by a phenylene group and/or an oxygen atom.

Wherein, $R^{12}$ is preferably a straight or branched alkyl group having 8 to 11 carbon atoms.

Specific examples of the anionic surfactant represented by the general formula (8) include n-octanesulfonic acid, n-nonanesulfonic acid, n-decanesulfonic acid, and n-undecanesulfonic acid. Among these, n-octanesulfonic acid, n-nonanesulfonic acid, and n-decanesulfonic acid are preferred.

Furthermore, examples of the anionic surfactant include anionic surfactants represented by the general formula (9) and the general formula (10).

In the above general formulae (9) and (10), $R^{13}$ and $R^{14}$ each independently represent a straight or branched alkyl group having 1 to 20 carbon atoms, and x and y each independently represent an integer of 1 to 50.

$R^{13}$ and $R^{14}$ are preferably a straight or branched alkyl group having 1 to 14 carbon atoms, and specifically, a methyl group, an ethyl group, and a propyl group are preferred. x and y are preferably an integer of 3 to 30.

Specific examples of the anionic surfactant represented by the general formulae (9) and (10) include SOFTANOL 30, SOFTANOL 50, SOFTANOL 70, and SOFTANOL 90 (all manufactured by Nippon Shokubai Co., Ltd.). Among these, SOFTANOL 30, SOFTANOL 50, and SOFTANOL 70 are preferred.

Amount of Surfactant Added

The amount of such surfactants which may be added is preferably no less than 100 ppm by mass and no greater than 10,000 ppm by mass, and more preferably no less than 500 ppm by mass and no greater than 5,000 ppm by mass based on the total amount of the composition for forming an anti-reflection film. The coating properties of the composition for forming an anti-reflection film can be improved by adding the nonionic surfactant and the anionic surfactant in an amount within the above range.

Solvent

Although the composition for forming an anti-reflection film of the present invention is usually used in the form of an aqueous solution, an alcoholic organic solvent may be added as needed since the solubility of the aforementioned fluorochemical surfactant is enhanced by including the alcoholic organic solvent such as isopropyl alcohol or trifluoroalcohol, whereby the uniformity of the coated film can be improved. It is preferred that the amount of the alcoholic organic solvent added to the composition for forming an anti-reflection film be selected within the range of no greater than 15% by mass of the total mass of the solvent added to the composition.

Method for Forming Resist Pattern

The method for forming a resist pattern of the present invention is a method which includes: forming a resist film on a substrate; forming an anti-reflection film on the resist film using the composition for forming an anti-reflection film of the present invention; selectively irradiating the resist film, through the anti-reflection film, with light, resulting in an irradiated resist film, and carrying out heat treatment as needed; and removing the anti-reflection film to obtain the resist pattern before subjecting the irradiated resist film to a developing process or during the development process.

Resist Composition

The resist composition which can be used in the method for forming a resist pattern of the present invention is not particularly limited, and can be freely selected from commonly used compositions. Moreover, any of positive and negative resist compositions can be used, and one which includes a photosensitive material and a film forming material, and is easily developed with an aqueous alkaline solution may be suitably used, in particular.

Particularly preferable resist compositions are positive and negative resist compositions having a variety of required characteristics which can be adapted satisfactorily for ultrafine processing. Exemplary positive resist compositions may include compositions which contain a quinonediazide photosensitive material and a film forming material. Alternatively, chemically amplified resist compositions may be also exemplified which exhibit increased alkaline solubility due to the catalytic action of the acid generated upon exposure.

The negative resist composition is not particularly limited, and any conventionally known negative resist compositions can be used. The chemically amplified negative resist compositions which have been used as a negative resist composition for fine pattern formation, and including three components, i.e., a crosslinking agent, an acid generator, and a base polymer, can be particularly preferably used.

Formation of Resist Film and Anti-Reflection Film

Upon formation of the resist film and the anti-reflection film, the resist composition is first applied on a substrate such as Si, Cu or Au by a spinner process, and the solvent is then volatilized by carrying out a heat treatment. Next, the composition for forming an anti-reflection film of the present invention is applied on the resist film by a spinner process, followed by heat treatment to form an anti-reflection film on the resist film. The heat treatment in forming the anti-reflection film is not necessarily a prerequisite, and the heating may not be carried out when only the application yields a favorable coating film that is superior in uniformity.

Exposure, Development and the Like

After the anti-reflection film is formed, the resist film is selectively irradiated, through the anti-reflection film, with an actinic ray such as ultraviolet ray and far-ultraviolet ray (including excimer laser). Thereafter, heat treatment is carried out if necessary, and a developing process is then carried out to form a resist pattern on the substrate.

The anti-reflection film has an optimal film thickness for efficiently reducing the interference effect of the actinic rays, and this optimal film thickness corresponds to the odd multiple of $\lambda/4n$ (wherein, $\lambda$ represents the wavelength of the actinic ray employed; and n represents the refractive index of the anti-reflection film). For example, in the case of an anti-reflection film having a refractive index of 1.41, the optimal thickness for each of the actinic rays will be: the odd multiple of 77 nm for ultraviolet rays (g-rays); the odd multiple of 65 nm for ultraviolet rays (i-rays); and the odd multiple of 44 nm for far-ultraviolet rays (excimer laser), and the thickness of the anti-reflection film preferably falls within the range of each optimal film thickness ±5 nm.

Moreover, formation of this anti-reflection film on a chemically amplified negative or positive resist film is preferred since the effect of improving resist pattern configuration is achieved in addition to the anti-reflective effect. In general, the chemically amplified resists are accompanied by deficiency in acid on the resist film surface resulting from the action of organic alkaline vapor such as N-methyl-2-pyrrolidone, ammonia, pyridine or triethylamine present in the ambient air around the manufacture line of semiconductors. Therefore, when a negative resist is employed, the upper extremity of the resist pattern is likely to be rounded, while the resist patterns may be linked to form an eave-like shape when a positive resist is used. The effect of improving resist pattern configuration is to prevent such events, and enabling formation of a rectangular resist pattern configuration. As in the foregoing, the anti-reflection film can be suitably used also as a protective film material of the chemically amplified resist films. In addition, the anti-reflection film leads to favorable film stability, similarly to the case in which $C_8F_{17}SO_3H$ (PFOS) is used as a fluorochemical surfactant The anti-reflection film may be removed concurrently with the development process of the resist film, but to subject the anti-reflection film to a peeling process prior to the development process is preferred in order to remove it completely. This peeling process can be carried out by completely removing only the anti-reflection film by applying a solvent that dissolves to remove the anti-reflection film while rotating the silicon wafer by a spinner, for example. As the solvent for removing the anti-reflection film, an aqueous solution including a surfactant can be used.

EXAMPLES

Hereinafter, the present invention will be explained in detail by way of Examples. It should be noted that the present invention is not in anyway limited to the following Examples.

Example 1

To 97.2 parts by mass of pure water were added 0.84 parts by mass of polyhydroxyethyl acrylate as a water soluble film-forming component, 1.68 parts by mass of "PF-136A" (a compound represented by the above formula (1c), degree of polymerization: 6, manufactured by Omnova Solutions, Inc.) as a fluorine compound having a constituent unit represented by the general formula (1), 0.25 parts by mass of tetrafluorophthalic acid as a pH adjuster, and 0.05 parts by mass of "SOFTANOL 30" (manufactured by Nippon Shokubai Co., Ltd.) as a nonionic surfactant. To this mixture was added 3-amino-1,2-propanediol as a nitrogen-containing compound, and the pH was adjusted to 2.0, whereby a composition for forming an anti-reflection film was obtained.

Example 2

To 97.2 parts by mass of pure water were added 0.84 parts by mass of polyhydroxyethyl acrylate as a water soluble film-forming component, 1.68 parts by mass of "PF-156A" (a compound represented by the above formula (1d), degree of polymerization: 6, manufactured by Omnova Solutions, Inc.) as a fluorine compound having a constituent unit represented by the general formula (1), 0.25 parts by mass of tetrafluorophthalic acid as a pH adjuster, and 0.05 parts by mass of "SOFTANOL 30" (manufactured by Nippon Shokubai Co., Ltd.) as a nonionic surfactant. To this mixture was added 3-amino-1,2-propanediol as a nitrogen-containing compound, and the pH was adjusted to 2.0, whereby a composition for forming an anti-reflection film was obtained.

Example 3

To 97.2 parts by mass of pure water were added 2.52 parts by mass of "PF-156A" (a compound represented by the above formula (1d), degree of polymerization: 6, manufactured by Omnova Solutions, Inc.) as a fluorine compound having a constituent unit represented by the general formula (1), 0.25 parts by mass of tetrafluorophthalic acid as a pH adjuster, and 0.05 parts by mass of "SOFTANOL 30" (manufactured by Nippon Shokubai Co., Ltd.) as a nonionic surfactant. To this mixture was added 3-amino-1,2-propanediol as a nitrogen-containing compound, and the pH was adjusted to 2.0, whereby a composition for forming an anti-reflection film was obtained.

Example 4

To 97.4 parts by mass of pure water were added 2.52 parts by mass of "PF-156A" (a compound represented by the above formula (1d), degree of polymerization: 6, manufactured by Omnova Solutions, Inc.) as a fluorine compound having a constituent unit represented by the general formula (1), and 0.05 parts by mass of "SOFTANOL 30" (manufactured by Nippon Shokubai Co., Ltd.) as a nonionic surfactant. To this mixture was added 3-amino-1,2-propanediol as a nitrogen-containing compound, and the pH was adjusted to 2.0, whereby a composition for forming an anti-reflection film was obtained.

Example 5

To 97.4 parts by mass of pure water were added 2.52 parts by mass of "PF-156A" (a compound represented by the above formula (1d), degree of polymerization: 6, manufactured by Omnova Solutions, Inc.) as a fluorine compound having a constituent unit represented by the general formula (1), and 0.05 parts by mass of "SOFTANOL 30" (manufactured by Nippon Shokubai Co., Ltd.) as a nonionic surfactant. To this mixture was added tetrafluorophthalic acid as a pH adjuster to adjust the pH to 2.0, whereby a composition for forming an anti-reflection film was obtained.

Comparative Example 1

A composition for forming an anti-reflection film was obtained by adding to 97.2 parts by mass of a 5% aqueous isopropyl alcohol solution, 0.84 parts by mass of polyhydroxyethyl acrylate as a water soluble film-forming component, 1.68 parts by mass of "EF-101" (PFOS, manufactured by Mitsubishi Materials Corporation) as a fluorochemical surfactant, 0.26 parts by mass of 2-amino-1,3-propanediol as a nitrogen-containing compound and 0.05 parts by mass of "SOFTANOL 30" (manufactured by Nippon Shokubai Co., Ltd.) as a nonionic surfactant.

Evaluation of Optical Characteristics

TDUR-P3435 (trade name)" (manufactured by Tokyo Ohka Kogyo Co., Ltd.) was coated as a positive resist composition on an 8-inch silicon wafer using a spinner, followed by subjecting to a heat treatment of 90° C. for 60 sec to obtain a resist film having a film thickness of 310 nm. The composition for forming an anti-reflection film obtained in any one of Examples 1 to 5, or Comparative Example 1 was coated on thus obtained resist film using a spinner, and subjected to a heat treatment of 60° C. for 60 sec. The anti-reflection film had a film thickness of 44 nm.

Using a spectroellipsometer "Wvase32 (product name)" (manufactured by J. A. WOOLLAM JAPAN Corp.), the refractive index (n value) and the extinction coefficient (k value) at 248 nm, 365 nm, and 633 nm were measured on the aforementioned layered products. The results are shown in Table 1.

Table 1 shows that the layered products obtained using the compositions for forming an anti-reflection film of Examples 1 to 5 exhibited similar refractive indices and extinction coefficients to those of the layered product obtained using the composition for forming an anti-reflection film of Comparative Example 1 containing PFOS as a fluorochemical surfactant.

TABLE 1

| | n value | | | k value | | |
|---|---|---|---|---|---|---|
| | 248 nm | 365 nm | 633 nm | 248 nm | 365 nm | 633 nm |
| Example 1 | 1.48 | 1.44 | 1.41 | 0.00 | 0.00 | 0.00 |
| Example 2 | 1.47 | 1.43 | 1.40 | 0.00 | 0.00 | 0.00 |
| Example 3 | 1.45 | 1.41 | 1.38 | 0.00 | 0.00 | 0.00 |
| Example 4 | 1.46 | 1.42 | 1.39 | 0.00 | 0.00 | 0.00 |
| Example 5 | 1.45 | 1.41 | 1.38 | 0.00 | 0.00 | 0.00 |
| Comparative Example 1 | 1.49 | 1.43 | 1.43 | 0.00 | 0.00 | 0.00 |

Evaluation of Resist Pattern Configuration

By a similar method to that employed in "Evaluation of Optical Characteristics", a layered product was manufactured using the anti-reflection film obtained in any one of Examples 1 to 5 or Comparative Example 1.

The aforementioned layered product was irradiated with a KrF excimer laser (248 nm) through a mask pattern using a reduced projection exposure aligner "NSR-S203B" (trade name, manufactured by Nikon Corporation), and subjected to a baking process on a hot plate at 90° C. for 60 sec. Thereafter, the layered product was washed with pure water for 6 sec, and developed using an aqueous solution of NMD-3 (manufactured by Tokyo Ohka Kogyo Co., Ltd.), at 23° C. for 30 sec, followed by washing with pure water for 10 sec to obtain a resist pattern.

Thus formed 180 nm line pattern on the silicon wafer was observed with a scanning electron microscope (SEM), and the pattern configuration of the resist pattern was evaluated. Consequently, the layered products obtained using the compositions for forming the anti-reflection film of Examples 1 to 5 exhibited similar characteristics even as compared with the layered product obtained using the composition for forming an anti-reflection film of Comparative Example 1. In particular, resist patterns having favorable pattern configuration could be obtained in Examples 3 to 5 despite that, any water soluble film-forming component was not added.

The invention claimed is:

1. A method for forming a resist pattern, the method comprising:

forming a resist film on a substrate;

forming an anti-reflection film on the resist film using a composition for forming an anti-reflection film;

selectively irradiating the resist film, through the anti-reflection film, with light; and subjecting the irradiated resist film to a developing process, wherein the anti-reflection film is removed to obtain the resist pattern before subjecting the irradiated resist film to a developing process or during the developing process; and wherein the composition for forming an anti-reflection film comprises:

0.3% by mass to 10% by mass of a compound having a constituent unit represented by formula (1):

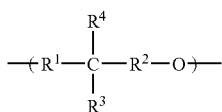

wherein $R^1$ and $R^2$ each represent a direct bond or a methylene chain; $R^3$ and $R^4$ each represent a hydrogen atom, an alkyl group having 1 to 10 carbon atoms, or a group represented by $-(CH_2)_n-O-R^5-R^6$, wherein at least one of $R^3$ and $R^4$ is a group represented by $-(CH_2)_n-O-R^5-R^6$; $R^5$ represents a direct bond or an alkylene chain having 1 to 10 carbon atoms which may be interrupted with $-O-$; $R^6$ represents an alkyl group having 1 to 10 carbon atoms in which a portion or all hydrogen atoms are substituted with a fluorine atom; n represents an integer of 0 to 10; and a total number of carbon atoms present in $R^1$ and $R^2$ is 1 or 2, a nitrogen-containing compound, and water.

2. The method for forming a resist pattern according to claim 1, wherein the compound having a constituent unit represented by formula (1) has a mass-average molecular weight of no less than 300 and no greater than 3,000.

3. The method for forming a resist pattern according to claim 1, wherein the composition for forming an anti-reflection film further comprises at least one water soluble resin selected from the group consisting of a cellulosic polymer, an acrylic acid-based polymer, and a vinyl based polymer, wherein the acrylic acid-based polymer is a polymer containing at least one monomer selected from acrylamide, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloylmorpholine, hydroxyethyl acrylate and acrylic acid, and the vinyl based polymer is at least one selected from polyvinyl alcohol and polyvinylpyrrolidone.

4. The method for forming a resist pattern according to claim 1, wherein the composition for forming an anti-reflection film further comprises a fluorochemical surfactant.

5. The method for forming a resist pattern according to claim 4, wherein the fluorochemical surfactant is at least one selected from compounds represented by the following formulae (2) to (5)

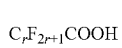

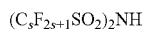

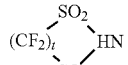

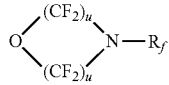

wherein r represents an integer of 10 to 15; s represents an integer of 1 to 5; t represents 2 or 3; u represents 2 or 3; $R_f$ represents a hydrogen atom or an alkyl group having 1 to 16 carbon atoms in which a portion or all hydrogen atoms are substituted with a fluorine atom; and the alkyl group having 1 to 16 carbon atoms in which a portion or all hydrogen atoms are substituted with a fluorine atom may have a hydroxy group, an alkoxyalkyl group, a carboxyl group, or an amino group.

6. The method for forming a resist pattern according to claim 1, wherein the nitrogen-containing compound is at least one selected from the group consisting of a quaternary ammonium hydroxide, an alkanolamine compound, and an amino acid derivative.

7. The method for forming a resist pattern according to claim 6, wherein the alkanolamine compound is at least one of 3-amino-1,2-propanediol and 2-amino-1,3-propanediol.

* * * * *